United States Patent [19]
Yokomura

[11] Patent Number: 5,440,259
[45] Date of Patent: Aug. 8, 1995

[54] FREQUENCY STABILIZING CIRCUIT FOR A π/4 SHIFT QPSK SIGNAL RECEIVERS

[75] Inventor: Ryouji Yokomura, Tokyo, Japan

[73] Assignee: NEC Corporation, Tokyo, Japan

[21] Appl. No.: 97,017

[22] Filed: Jul. 27, 1993

[30] Foreign Application Priority Data

Jul. 30, 1992 [JP] Japan .................. 4-202806

[51] Int. Cl.[6] .................. H03D 3/04; H03L 7/18
[52] U.S. Cl. .................. 327/160; 327/156; 329/306
[58] Field of Search .............. 307/271; 328/166; 329/306, 307; 327/156, 160

[56] References Cited

U.S. PATENT DOCUMENTS

| 4,773,083 | 9/1988 | Baumbach et al. | 328/166 |
| 5,097,220 | 3/1992 | Shimakata et al. | 329/306 |
| 5,121,070 | 6/1992 | Tomita | 329/307 |

Primary Examiner—John S. Heyman
Attorney, Agent, or Firm—Young & Thompson

[57] ABSTRACT

A frequency stabilizing circuit for a π/4 QPSK (Quadrature Phase Shift Keying) signal receiver has a voltage controlled oscillator (VCO) for outputting an oscillation signal whose frequency changes in response to a control voltage applied to the VCO. A mixer changes the frequency of an input π/4 shift QPSK signal. A counter measures the frequency of the π/4 shift QPSK signal from the mixer. A timing generator generates, on the basis of the oscillation signal from the VCO, a timing indicative of an interval during which the counter is to measure the frequency. A set data generator generates a frequency signal having a predetermined set frequency. A comparator compares the frequency measured by the counter and the set frequency of the set data generator to thereby output the resulting frequency deviation. A voltage data generator changes voltage data in association with the frequency deviation. A digital-to-analog converter transforms the voltage data to the control voltage. A demodulator demodulates the π/4 shift QPSK signal from the mixer. An integrator adds up phase shifts output from the demodulator over the interval generated by the timing generator. An adder/subtracter selectively increases or decreases the set frequency of the frequency signal output from the data generator in association with a cumulative phase shift produced by the integrator. The circuit is capable of stabilizing the frequency of a π/4 shift QPSK signal receiver even when the mean frequency differs from the carrier frequency due to the offset of data.

1 Claim, 2 Drawing Sheets

FREQUENCY STABILIZING CIRCUIT FOR A $\pi/4$ SHIFT QPSK SIGNAL RECEIVERS

BACKGROUND OF THE INVENTION

1. Field of the Invention

The present invention relates to a $\pi/4$ QPSK (Quadrature Phase Shift Keying) signal receiver and, more particularly, to a circuit for stabilizing the frequency of a $\pi/4$ QPSK signal receiver.

2. Description of the Related Art

It is a common practice with a circuit for the above application to stabilize the frequency of the receiver by measuring the frequency of a $\pi/4$ shift QPSK signal. This brings about a problem that when the mean frequency of the QPSK signal differs from the carrier frequency due to the offset of data included in the signal, a local oscillator cannot be stabilized at a correct frequency.

SUMMARY OF THE INVENTION

It is therefore an object of the present invention is to provide a frequency stabilizing circuit capable of stabilizing the frequency of a $\pi/4$ shift QPSK signal receiver even when the mean frequency differs from the carrier frequency due to the offset of data.

A frequency stabilizing circuit for a $\pi/4$ QPSK signal receiver of the present invention has a voltage controlled oscillator (VCO) for outputting an oscillation signal whose frequency changes in response to a control voltage applied to the VCO. A mixer changes the frequency of an input $\pi/4$ shift QPSK signal. A counter measures the frequency of the $\pi/4$ shift QPSK signal from the mixer. A timing generator generates, on the basis of the oscillation signal from the VCO, a timing indicative of an interval during which the counter is to measure the frequency. A set data generator generates a frequency signal having a predetermined set frequency. A comparator compares the frequency measured by the counter and the set frequency of the set data generator to thereby output the resulting frequency deviation. A voltage data generator changes voltage data in association with the frequency deviation. A digital-to-analog converter transforms the voltage data to the control voltage. A demodulator demodulates the $\pi/4$ shift QPSK signal from the mixer. An integrator adds up phase shifts output from the demodulator over the interval generated by the timing generator. An adder/subtracter selectively increases or decreases the set frequency of the frequency signal output from the data generator in association with a cumulative phase shift produced by the integrator.

BRIEF DESCRIPTION OF THE DRAWINGS

The above and other objects, features and advantages of the present invention will become more apparent from the following detailed description taken with the accompanying drawings in which.

DESCRIPTION OF THE PREFERRED EMBODIMENT

Figure 1:
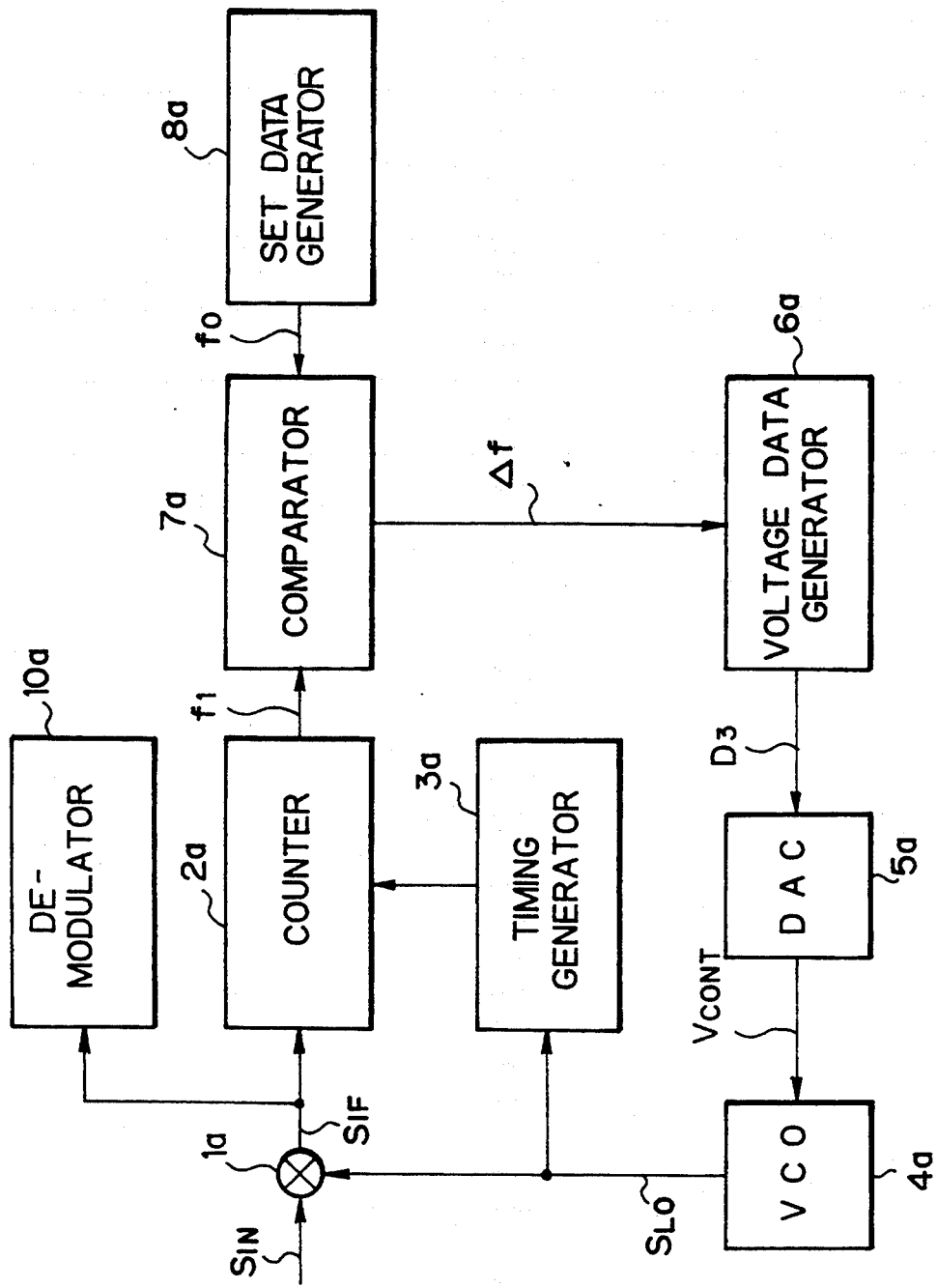
FIG. 1 is a block diagram schematically showing a conventional frequency stabilizing circuit for a $\pi/4$ QPSK signal receiver.

To better understand the present invention, a brief reference will be made to a prior art frequency stabilizing circuit, shown in FIG. 1. As shown, the circuit has a mixer 1a which receives a $\pi/4$ shift QPSK signal $S_{IN}$ and a local oscillation signal $S_{LO}$, and in turn outputs an intermediate frequency (IF) signal $S_{IF}$ different in frequency from the QPSK signal. A voltage controlled oscillator (VCO) 4a produces the local oscillation signal $S_{LO}$ while changing the frequency of the signal $S_{LO}$ in response to a change in a control voltage $V_{CONT}$. A counter 2a produces a signal having a frequency $f_1$ in response to the IF signal $S_{IF}$. A timing generator 3a also receives the local oscillation signal $S_{LO}$ from the VCO 4a to generate a timing indicative of the interval during which the counter 2a measures the frequency of the IF signal $S_{IF}$. A set data generator 8a generates a signal having a set frequency $f_0$. A comparator 7a compares the output frequency $f_1$ of the counter 2a with the set frequency $f_0$ and produces the resulting difference or deviation $\Delta f$. A voltage data generator 6a produces voltage data $D_3$ while changing it in association with the frequency deviation $\Delta f$. A digital-to-analog converter (DAC) 5a transforms the voltage data $D_3$ to the previously mentioned control voltage $V_{CONT}$ for controlling the VCO 4a. A demodulator 10a demodulates the QPSK signal $S_{IF}$. Regarding the accuracy of the comparator 7a, the frequency deviation is $\Delta f/f_{LO}$ since the interval for the measurement of the counter 2a is determined by the local oscillation frequency $S_{LO}$.

In the frequency stabilizing circuit described above, the frequency of the QPSK signal SIN is measured to stabilize the frequency. As a result, when the mean frequency of the QPSK signal SIN differs from the carrier frequency due to the offset of data included in the signal SIN, the VCO or local oscillator 4a cannot be stabilized at a correct frequency thereof, as discussed earlier.

Figure 2:
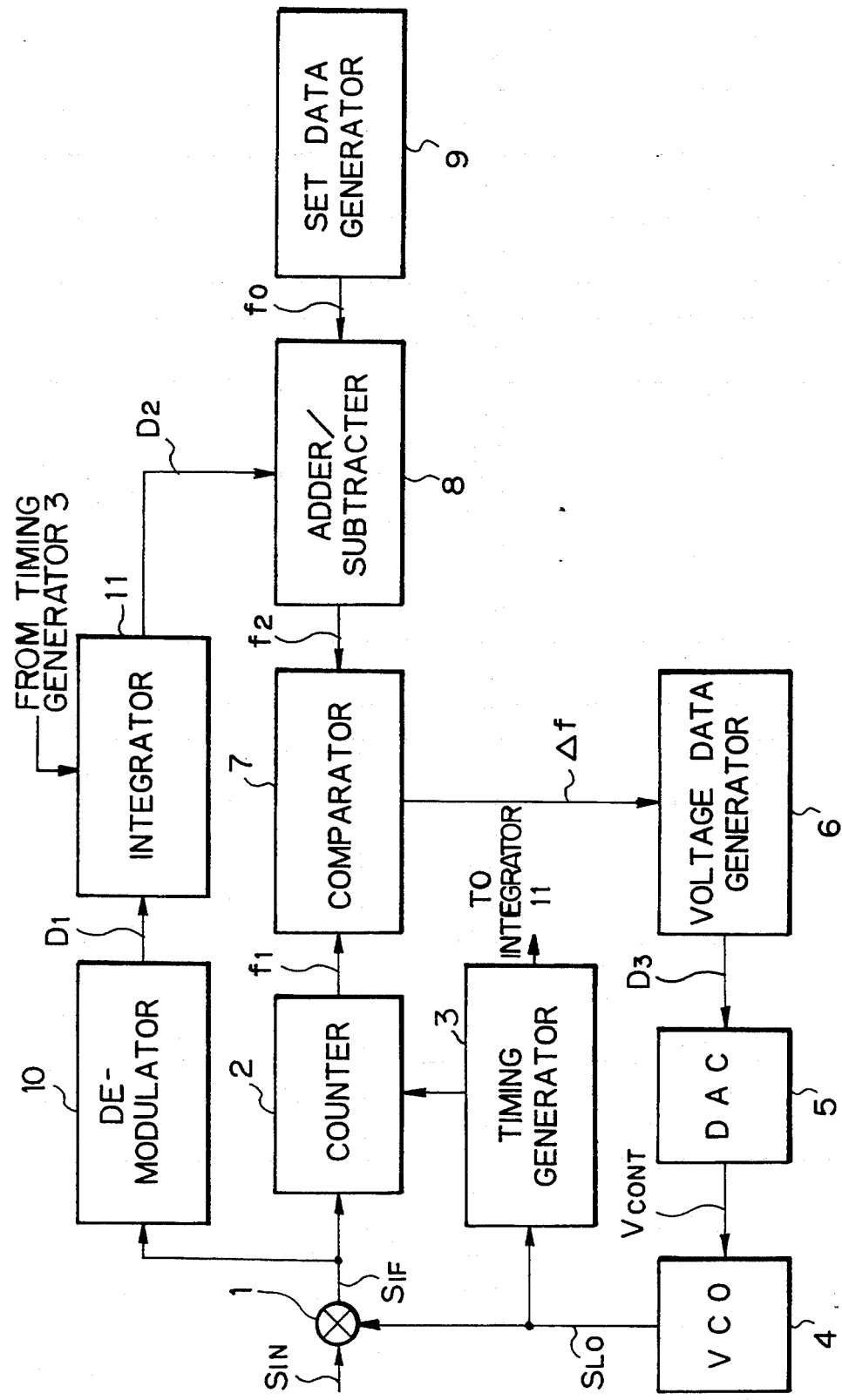
FIG. 2 is a schematic block diagram of a frequency stabilizing circuit embodying the present invention.

Referring to FIG. 2, a preferred embodiment of the frequency stabilizing circuit for a $\pi/4$ shift QPSK signal receiver in accordance with the present invention will be described. As shown, the circuit has a VCO 4 for outputting a local oscillation signal $S_{LO}$ whose frequency changes with a change in a control signal $V_{CONT}$. A mixer 1 changes the frequency of an input $\pi/4$ QPSK signal $S_{IN}$, thereby producing an IF signal $S_{IF}$. A counter 2 measures the frequency $f_1$ of the IF signal $S_{IF}$. A timing generator 3 generates a timing indicative of an interval during which the counter 2 measures the IF signal $S_{IF}$ on the basis of the local oscillation signal $S_{LO}$. A demodulator 10 demodulates the IF signal $S_{IF}$ to output phase shift data $D_1$. An integrator 11 adds up the phase shifts $D_1$ over the interval defined by the timing generator 3 and meant for the counter 2. A set data generator 9 outputs a signal having a set frequency $f_0$. An adder/subtracter 8 selectively increases or decreases the set frequency $f_0$ from the set data generator 9 in association with the integrated value $D_2$ from the integrator 11. A comparator 7 compares the output frequency $f_1$ of the counter 2 with the output $f_2$ of the adder/subtracter 8 and outputs the resulting deviation $\Delta f$. A voltage data generator 6 produces voltage data $D_3$ while changing it in association with the deviation $\Delta f$. A DAC 5 transforms the voltage data $D_3$ to the previously mentioned control voltage $V_{CONT}$ for controlling the VCO 4.

More specifically, the mixer 1 receives the input $\pi/4$ shift QPSK signal $S_{IN}$ and local oscillation signal $S_{LO}$ and changes the frequency of the signal $S_{IN}$ to output the resulting IF signal $S_{IF}$. The IF signal $S_{IF}$ is a $\pi/4$ QPSK signal having a carrier frequency equal to the difference in frequency between the input QPSK signal $S_{IN}$ and the local oscillation signal $S_{LO}$. The counter 2 measures the frequency of the IF signal $S_{IF}$ output from the mixer 1. The timing generator 3 is responsive to the local oscillation signal $S_{LO}$ for generating the timing of an interval during which the counter 2 is to measure the frequency. The demodulator 10 outputs the amount of phase shift $D_1$ during each baud period. The integrator 11 adds up the phase shifts $D_1$ over the interval generated by the timing generator 3, thereby producing cumulative data $D_2$. The adder/subtracter 8 increases or decreases the set frequency $f_0$ from the set data generator 9 in matching relation to the cumulative phase shift data $D_2$. As a result, the adder/subtracter 8 produces a signal having a frequency $f_2$ matching a change in the frequency of the IF signal $S_{IF}$. The comparator 7 compares the output frequency $f_2$ of the adder/subtracter 8 and the frequency $f_1$ of the IF signal $S_{IF}$ measured by the counter 2, thereby producing the resulting frequency deviation $\Delta f$. The voltage data generator 6 generates voltage data $D_3$ corresponding to the frequency deviation $\Delta f$. The DAC 5 converts the voltage data $D_3$ to a control voltage $V_{CONT}$ for controlling the VCO 4. Consequently, the VCO 4 outputs a local oscillation signal $S_{LO}$.

The $\pi/4$ shift QPSK signal undergoes a phase change of $\pm\pi/4$ or $\pm 3/4\pi$ during each baud period. Assuming that the total phase change during the frequency measuring interval is $\Sigma\Delta\phi$, then the frequency $S_{IF}$ of the IF signal changes by $\Sigma\Delta\phi/2\pi \times 1/t$. This frequency change is added to or subtracted from the set frequency $f_0$.

In summary, it will be seen that the present invention provides a circuit capable of stabilizing the frequency of a local oscillator such that the carrier frequency of an IF signal remains stable. This unprecedented advantage is derived from the fact that the circuit measures a phase shift in terms of a frequency deviation and is, therefore, free from the influence of the offset of data.

Various modifications will become possible for those skilled in the art after receiving the teachings of the present disclosure without departing from the scope thereof.

What is claimed is:

1. A circuit for stabilizing a frequency of a $\pi/4$ shift Quadrature Phase Shift Keying (QPSK) signal receiver, comprising:

a Voltage Controlled Oscillator (VCO) for outputting an oscillation signal whose frequency changes in response to an analog control voltage applied to said VCO;

a mixer having one input connected to said oscillation signal and another input connected to an input $\pi/4$ shift QPSK signal, said mixer changing a frequency of said input shift $\pi/4$ shift QPSK signal;

a counter for measuring the frequency of the $\pi/4$ shift QPSK signal output from said mixer;

a timing generator having an input connected to said oscillation signal for generating, on the basis of the oscillation signal from said VCO, an output timing signal indicative of an interval during which said counter is to measure the frequency;

a set data generator for generating a frequency signal having a predetermined set frequency;

a comparator for comparing the frequency measured by said counter and the set frequency of said set data generator to thereby output a resulting frequency deviation signal;

a voltage data generator having an input connected to said frequency deviation signal for changing voltage data depending on the frequency deviation signal;

a digital-to-analog converter for converting a digital output of said voltage data generator to said analog control voltage;

a demodulator connected to an output of said mixer for demodulating the $\pi/4$ shift QPSK signal from said mixer;

an integrator having one input connected to an output of said demodulator and another input connected to said timing generator, said integrator integrating phase shifts output from said demodulator over said interval generated by said timing generator; and an adder/subtracter interposed between said set data generator and said comparator and responsive to said integrator for selectively increasing or decreasing the set frequency of the frequency signal output from said set data generator depending on a cumulative phase shift produced by said integrator and input to said adder/subtracter.

* * * * *